(12) United States Patent
Yoo

(10) Patent No.: US 6,242,341 B1
(45) Date of Patent: Jun. 5, 2001

(54) PLANARIZATION USING LASER ABLATION

(75) Inventor: Chue-San Yoo, Hsin-chu (TW)

(73) Assignee: Taiwan Semiconductor Manufacturing Company, Hsin-chu (TW)

(*) Notice: Subject to any disclaimer, the term of this patent is extended or adjusted under 35 U.S.C. 154(b) by 0 days.

(21) Appl. No.: 09/332,423

(22) Filed: Jun. 14, 1999

(51) Int. Cl.[7] ................................................. H01L 21/44
(52) U.S. Cl. .................... 438/626; 438/600; 438/601; 438/662; 216/56; 427/555; 445/50
(58) Field of Search ................................ 438/626, 662, 438/600, 601; 427/555; 445/50; 216/56

(56) References Cited

U.S. PATENT DOCUMENTS

| | | | |
|---|---|---|---|
| 4,508,749 | 4/1985 | Brannon et al. | 427/43.1 |
| 4,758,533 | 7/1988 | Magee et al. | 437/173 |
| 5,221,426 | 6/1993 | Tessier et al. | 156/643 |
| 5,236,551 | 8/1993 | Pan | 156/643 |
| 5,407,710 | * 4/1995 | Baum et al. | 427/555 |
| 5,633,195 | * 5/1997 | Guthrie et al. | 438/662 |
| 5,688,158 | * 11/1997 | Jone et al. | 445/50 |
| 5,766,497 | * 6/1998 | Mitwalsky et al. | 216/56 |
| 6,025,256 | * 2/2000 | Swenson et al. | 438/601 |

\* cited by examiner

*Primary Examiner*—Vu A. Le
*Assistant Examiner*—Pho Luu
(74) *Attorney, Agent, or Firm*—George O. Saile; Stephen B. Ackerman

(57) ABSTRACT

A process for planarization of a silicon wafer is described together with apparatus for implementing it. The process planarizes by directing a high-energy, pulsed laser beam in a direction parallel to the wafer surface while the wafer is rotating. The height of the beam relative to the wafer is carefully controlled thereby enabling the removal of all material above the lower edge of the beam to be removed from the wafer through laser ablation. The method works equally well for removal of metal (as in planarization of damascene wiring) or dielectric (as in planarization of conventional wiring). Once all excess material has been removed (typically requiring about 60 seconds) additional operation of the process does no harm so neither end point detection nor precise control of process time are required.

10 Claims, 2 Drawing Sheets

PLANARIZATION USING LASER ABLATION

FIELD OF THE INVENTION

The invention relates to the general field of integrated circuit manufacture with particular reference to planarization.

BACKGROUND OF THE INVENTION

Integrated circuits are formed by the deposition of many layers, each of which is shaped into a unique pattern before deposition of the next layer over it. As expected, once several such layers have been laid down, the topmost surface will have become significantly uneven and deposition of subsequent layers cannot be performed without the danger of unintended contact between layers occurring because of inadequate coverage. Thus, it is necessary to have a method for periodically planarizing the surface so that subsequent layers can be built up from a flat base.

For some years now, the preferred method of the prior art for achieving planarization has been chemical mechanical polishing (CMP). While effective, CMP is not without its problems. For example, in structures of the type illustrated in FIG. 1 (known as damascene wiring) dishing is liable to occur so that trenches in the surface that are to be filled with metal end up being under filled. Additionally, many CMP procedures require an efficient method of end point detection so that over polishing does not occur. Even when it is adequate to perform CMP of the basis of time alone, careful control of this time must be exercised to avoid the same problem.

Another disadvantage of CMP is that it is relatively time-consuming since the time to remove material can be significant. Furthermore careful cleaning of the surface that has just been planarized must be performed to ensure the removal of all debris from the surface. There is thus a need for a planarzation process that is not time dependent, that does not introduce dishing, and that leaves no debris behind. Such a process, and the apparatus needed to implement it, constitute the present invention.

A routine search of the prior art was conducted but no references teaching the process or apparatus of the present invention were found. Although several references of interest were encountered, these all teach the application of lasers in a direction that is perpendicular to the surface being treated. For example, Brannon et al. (U.S. Pat. No. 4,508, 749) show a method of patterning polyimide films using a UV laser, preferably through a mask. By slightly angling the beam, holes having a positive slope can be formed.

Magee et al. (U.S. Pat. No. 4,758,533) achieve planarization by using a laser to cause local melting of the non-planar surface.

Tessier et al. (U.S. Pat. No. 5,221,426) use a laser to remove thinner portions of a non-planar surface. These cannot dissipate the incident radiation as effectively as the thicker portions so heat up to a higher temperature.

Pan (U.S. Pat. No. 5,236,551) use laser ablation to pattern a polymer layer thereby forming it into a mask which is then used to selectively remove material beneath it in a conventional manner.

SUMMARY OF THE INVENTION

It has been an object of the present invention to provide a process for planarizing the surface of integrated circuit wafer.

Another object of the invention has been to provide an apparatus suitable for implementing said process.

A further object of the invention has been that said process be equally applicable to planarizing both damascene and conventional wiring surfaces.

Yet another object of the invention has been that said process be significantly faster than processes of the prior art that perform similar functions.

A still further object on the invention has been that the process be self limiting so that end point detection not be required and over polishing not be possible.

These objects have been achieved by directing a high-energy, pulsed laser beam in a direction parallel to the wafer surface while the wafer is rotating. The height of the beam relative to the wafer is carefully controlled thereby enabling the removal of all material above the lower edge of the beam to be removed from the wafer through laser ablation. The method works equally well for removal of metal (as in planarization of damascene wiring) or dielectric (as in planarization of conventional wiring). Once all excess material has been removed (typically requiring about 10–200 seconds) additional operation of the process does no harm so neither end point detection nor precise control of process time are required.

DESCRIPTION OF THE PREFERRED EMBODIMENTS

We will describe the present invention in terms of the process that it teaches. In the course of doing so, the structure of the apparatus that has been invented will also become apparent.

Figure 1:
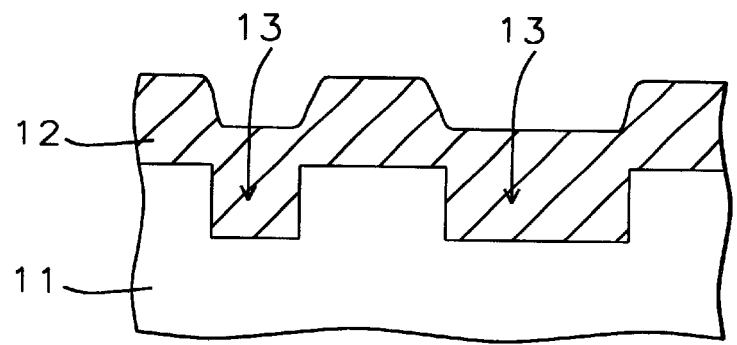
FIGS. 1 and 2 are cross-sections of surfaces that need to be planarized.
Figure 2:
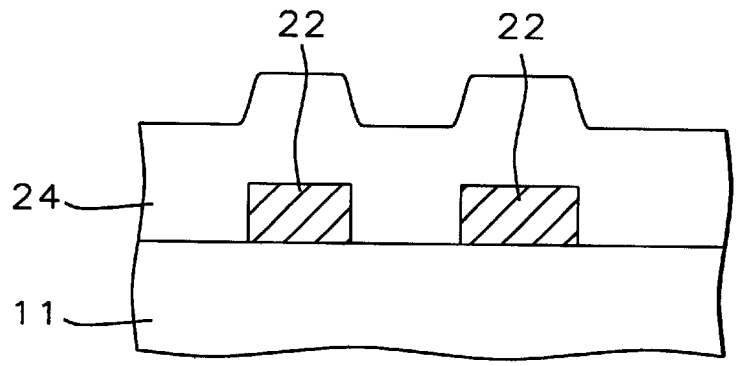

FIGS. 1 and 2 illustrate two possible starting points for implementing the process of the present invention. In both cases a schematic cross-section of a dielectric layer 11 is shown, said layer being an upper layer of an integrated circuit that has been formed on a silicon wafer. Once layer 11 was completed the next step would be to form a pattern of wires on its surface for the purpose of connecting together different parts of the integrated circuit. Such wiring may be formed in two different ways.

The first way is illustrated in FIG. 1. Prior to the deposition of metal layer 12, trenches, such as 13, were formed in the surface of layer 11. Then, layer 12 was deposited in sufficient quantity to ensure that the trenches were overfilled. This gave the structure the appearance shown in FIG. 1.

The second way is illustrated in FIG. 2. A blanket layer of metal was deposited over the surface of 11 and then patterned and etched to form a wiring pattern of which wires 22 (seen end-on) are examples. Then, dielectric layer 24 was deposited in sufficient quantity to ensure that wires 22 were fully covered. This gave the structure the appearance shown in FIG. 2.

For both structures the next step would be to remove sufficient material so that the surfaces of layers 12 and 24 became planar. For the structure seen in FIG. 1 it would be necessary to remove material from layer 12 until the trenches were only just filled. That is, all material on the surface of 11, outside the trenches, would need to be removed. For the structure of FIG. 2, the amount of layer 24 that remains after planarization has been achieved is optional, including removal of all of 24 that extends above metal 22.

We will use the structure shown in FIG. 2 as the vehicle for illustrating the process of the present invention but it will be understood that this process may be applied just as readily and just as effectively to the structure shown in FIG. 1.

Figure 3:
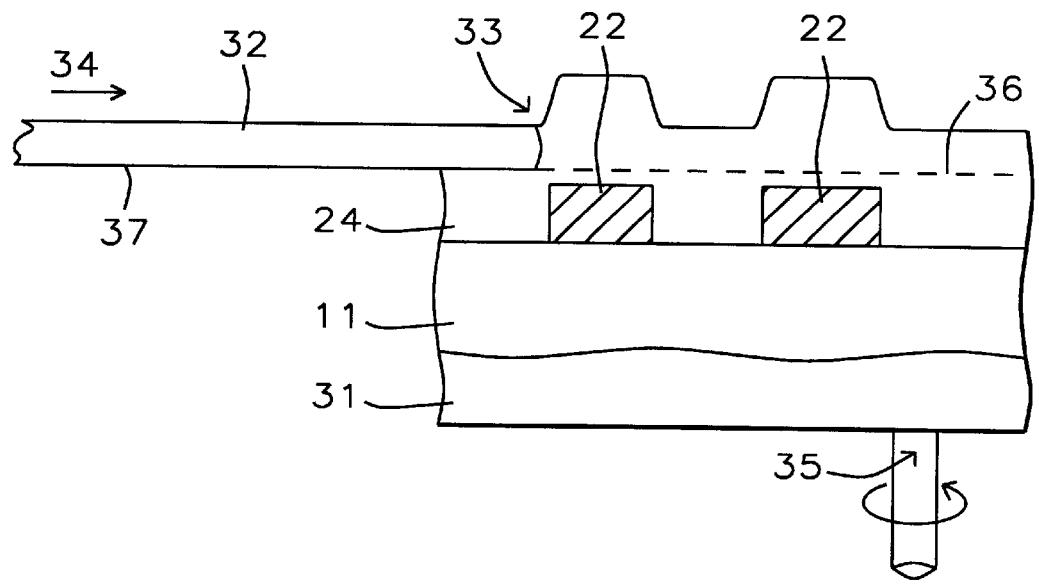
FIG. 3 is a schematic cross-sections of the invention showing a wafer mounted on a rotating table while a laser beam is directed parallel to its surface.

Referring now to FIG. 3, seen there is a schematic cross-section of the figure that is shown in FIG. 2, after it has been mounted on a rotatable table. The latter is symbolized by layer 31 which also includes all the layers of the integrated circuit that lie below layer 11, the silicon that constitutes the body of the wafer, the rotatable table itself, and anything that was used to attach the wafer to the table, such as a vacuum chuck, a layer of adhesive, etc.

Also shown in FIG. 3 is laser beam 32. The choice of which laser to use is governed by several factors. It must be capable of delivering very high power densities in pulse form (a requirement for ablation in general) and it must have a wavelength that is strongly absorbed by the material under ablation. Accordingly a carbon laser was selected. For structures such as FIG. 1, where a metal (such as copper) is to be removed, the preferred wavelength for the laser radiation has been about 300 nM, while for structures such as FIG. 2, where dielectric material (such as silicon oxide, silicon nitride, or doped oxide) is to be removed, the preferred wavelength for the laser radiation has also been about 300 nM, but in either case a wavelength between about 100 and 1,000 nM might have been selected.

The laser beam is aimed at the mounted wafer in direction 34 which has been carefully adjusted to be parallel to the plane of the wafer. At the particular instant in time portrayed in FIG. 3, a small amount of layer 24 has been removed by laser ablation so that the beam extends as far as 33. Additional exposure to the beam will remove more of layer 24 until eventually a groove-like path, one diameter long, across the topmost layer 24 will have been raked clear.

Figure 4:
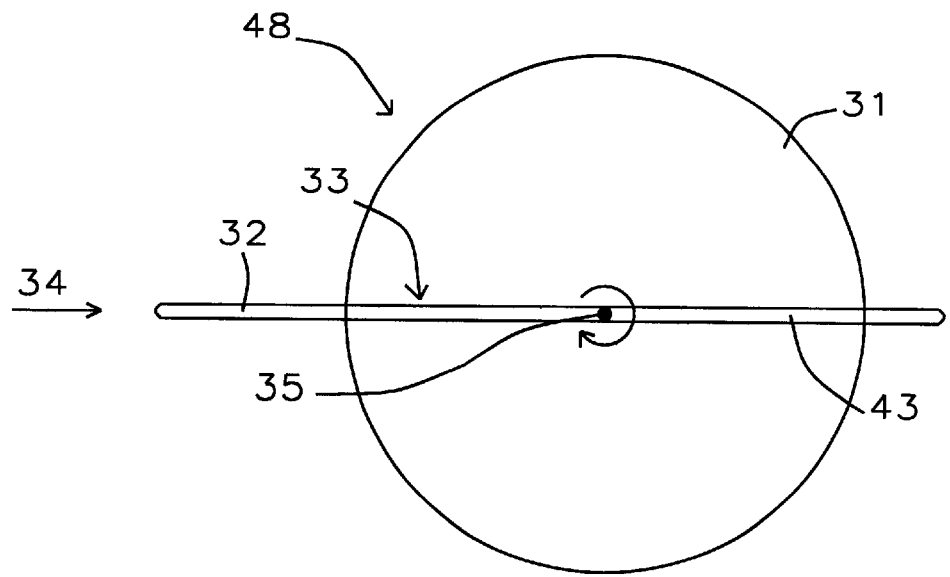
FIG. 4 is a plan view of the invention showing how said laser beam is directed to pass over the center of rotation.

FIG. 4 is a plan view of the full apparatus (with the exception of the laser source which is not shown). As shown, the laser beam passes directly over the center of rotation 35 of table 31. The path cleared by the laser is designated as 43 and coincides with the portion of 32 that lies within the boundaries of the wafer. In practice, the laser energy is delivered as a series of high energy density pulses while the wafer rotates so that a single clear groove such as 43 does not form. Rather, material is removed from all around the outside edge of the wafer, the cleared band then widening towards the center.

In order to control the depth of material removed by the process, a specific distance below the topmost surface of 24 is pre-selected (as symbolized by broken line 36 in FIG. 3) and the relative positions of the table and the laser beam adjusted (by moving only the beam or only the table or by moving both) so that the lower edge 37 (FIG. 3) of the beam is at said predetermined depth. The depth of removal is generally in the range of from about 1 to 40 microns and may be such that some of layer 24 remains above metal lines 22, removal plane 36 may coincide with the tops of the lines 22, or some of lines 22 may be removed as part of the intended planarization process. The latter case is more relevant when the process is applied to the structure of FIG. 1.

As ablation proceeds, debris is formed. This debris may be gaseous or it could be condensed vapor or it be solid particles resulting from the undercutting of a protrusion on the surface being planarized. In all cases, such debris needs to be removed before it has a chance to settle on and adhere to the surface of 24. To prevent this from happening, means (not shown) are provided for blowing all such debris off the surface and away from the wafer. This is symbolized by arrow 48 in FIG. 4 which represents a stream of dust free gas such as air, nitrogen, argon, or helium that is directed to blow over the surface of the wafer. The exact angle of 48 relative to 34 is unimportant as long as debris is not blown back at the laser itself.

The minimum time required to achieve full planarization is readily computed as follows:

If the length of material removed (parallel to the wafer surface) by a single laser pulse is L, and the wafer diameter is W, the total number of pulses needed to clear a single diameter of the wafer is W/L. For a beam diameter B, the number of (non-overlapping) diameters needed by the beam to cover the full wafer surface is ($\pi \times$W)/2B. Therefore the total number of pulses needed to planarize the wafer is $$(W/L) \times (\pi \times W)/2B$$

If the pulse rate is R pulses per unit time, it follows that the minimum time needed is $$(W^2 \times \pi)/(2B \times L \times R)$$

Thus, for L=20 microns, W=15 cm., B=1 micron, R=$10^6$ pulses/sec., the minimum time needed to planarize the wafer would be 17.6 seconds.

In practice, the time allowed for planarization is significantly longer (between about 30 and 300 seconds) because of possible overlap between of the cleared areas as they form. Additionally, the pulse rate may be any value in the range of about $10^2$ to about $10^6$ pulses per second while the rate of rotation for the table may be any value in the range of about 500 to about 3,000 RPM, with care being taken to avoid any stroboscopic relationship between these two parameters (otherwise paths running through certain diameters would never interact with the beam). In order to achieve a value for L in the range quoted above the energy density delivered by the beam needs to be between about 100 and 1,000 mJ/$cm^2$.sec while the actual beam diameter may vary from about 0.1 to about 10 microns.

Figure 5:
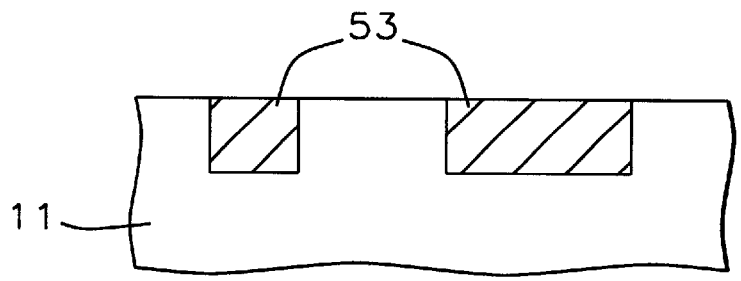
FIGS. 5 and 6 show the structures seen in FIGS. 1 and 2 respectively after planarization according to the process of the present invention has been performed.
Figure 6:
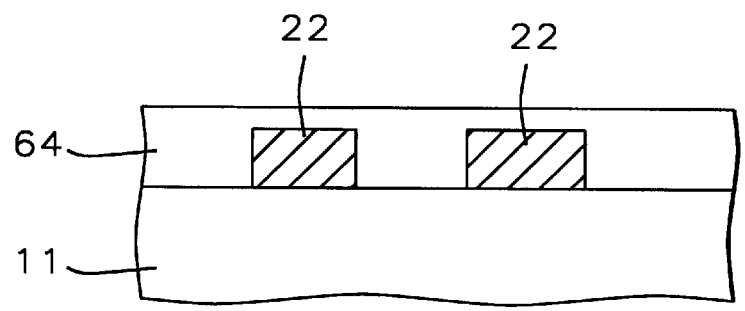

FIGS. 5 and 6 illustrate the structures of FIGS. 1 and 2 respectively after they have been planarized according to the process of the present invention. As can be seen, damascene wiring channels 53 have been formed without the presence of any dishing and without leaving any trace of metal on the surface of 11. In FIG. 6, former layer 24 has been reduced to planarized layer 64 and wires such as 22 are uniformly covered, with no thin spots at the edges.

While the invention has been particularly shown and described with reference to the preferred embodiments thereof, it will be understood by those skilled in the art that various changes in form and details may be made without departing from the spirit and scope of the invention.

What is claimed is:

1. A process for planarization through laser ablation, comprising:

providing an integrated circuit wafer that lies in a plane and has a top-most layer with an upper surface that is non-planar;

mounting said wafer on a rotatable table having a center of rotation perpendicular to the plane in which the wafer lies;

providing a laser that is capable of emitting a beam, having a lower edge, of radiation having a wavelength that is absorbed by material comprising said topmost layer;

mounting the laser whereby said beam lies in a plane parallel to the plane of the wafer while passing over said center of rotation, said lower edge being at a predetermined distance below said upper surface;

then causing the table to rotate at a speed between about 500 and 3,000 RPM while blowing dust free gas over the wafer; and activating the laser, thereby causing removal by ablation of all material in said top-most layer that lies above the lower edge of the beam.

2. The process of claim 1 wherein the topmost layer is copper.

3. The process of claim 2 wherein the wavelength of the laser is between about 100 and 1,000 nM.

4. The process of claim 1 wherein the topmost layer is a dielectric selected from the group consisting of silicon oxide, silicon nitride, and doped silicon oxide.

5. The process of claim 4 wherein the wavelength of the laser is between about 100 and 1,000 nM.

6. The process of claim 1 wherein said predetermined distance is between about 1 and 30 microns.

7. The process of claim 1 wherein the laser beam has a diameter that is between about 1 and 20 microns.

8. The process of claim 1 wherein the laser beam further comprises between about $10^2$ and $10^6$ laser light pulses per second.

9. The process of claim 8 wherein each pulse of the laser beam has an energy density of between about 100 and 1,000 $mJ/cm^2.sec$.

10. The process of claim 1 wherein the removal, by laser ablation, of all material in the topmost layer takes between about 30 and 300 seconds.

* * * * *